(12) United States Patent
Kemerling et al.

(10) Patent No.: US 7,626,272 B2
(45) Date of Patent: Dec. 1, 2009

(54) VIA CONFIGURABLE ARCHITECTURE FOR CUSTOMIZATION OF ANALOG CIRCUITRY IN A SEMICONDUCTOR DEVICE

(75) Inventors: James C. Kemerling, Lewisville, NC (US); David Ihme, Clemmons, NC (US); William D. Cox, Chapel Hill, NC (US)

(73) Assignees: Triad Semiconductor, Inc., Winston-Salem, NC (US); ViAsic, Inc., Durham, NC (US)

( * ) Notice: Subject to any disclaimer, the term of this patent is extended or adjusted under 35 U.S.C. 154(b) by 0 days.

(21) Appl. No.: 12/246,802

(22) Filed: Oct. 7, 2008

(65) Prior Publication Data

US 2009/0032968 A1 Feb. 5, 2009

Related U.S. Application Data

(62) Division of application No. 10/907,456, filed on Apr. 1, 2005, now Pat. No. 7,449,371.

(51) Int. Cl.
*H01L 23/12* (2006.01)
*H01L 23/52* (2006.01)
*H01L 29/40* (2006.01)

(52) U.S. Cl. .............................. 257/776; 257/E23.143; 257/E23.17

(58) Field of Classification Search ................. 257/776, 257/E23.143, E23.17
See application file for complete search history.

(56) References Cited

U.S. PATENT DOCUMENTS

| | | |
|---|---|---|
| 4,641,108 A | 2/1987 | Gill, Jr. |
| 4,734,654 A | 3/1988 | Fernandez |
| 4,760,349 A | 7/1988 | Park et al. |
| 4,852,015 A * | 7/1989 | Doyle, Jr. ................... 716/13 |
| 5,317,919 A | 6/1994 | Awtrey |
| 5,367,430 A | 11/1994 | DeVoe et al. |
| 5,404,265 A | 4/1995 | Moresco et al. |
| 5,459,634 A | 10/1995 | Nelson et al. |
| 5,517,040 A | 5/1996 | Hedman et al. |

(Continued)

FOREIGN PATENT DOCUMENTS

EP 0 491 567 6/1992

(Continued)

OTHER PUBLICATIONS

Triad Semiconductor, Inc., International Application Serial No. PCT/US2005/005836, "International Search Report," Aug. 1, 2005.

(Continued)

*Primary Examiner*—Leonardo Andújar
*Assistant Examiner*—Monica D Harrison
(74) *Attorney, Agent, or Firm*—Womble Carlyle

(57) ABSTRACT

A semiconductor device having a plurality of layers and a plurality of circuit elements arranged in tiles. At least one of the plurality of layers in the semiconductor device may be a via layer configured to determine the connections of the plurality of circuit elements. The semiconductor device may include an interconnection quilt having a plurality of metal layers disposed to interconnect the plurality of circuit elements. The plurality of circuit elements may be analog circuit element and/or digital circuit elements. The tiles may be analog tiles and digital tiles that form a mixed signal structured array.

22 Claims, 7 Drawing Sheets

U.S. PATENT DOCUMENTS

| | | |
|---|---|---|
| 5,590,016 A | 12/1996 | Fujishiro et al. |
| 5,821,776 A | 10/1998 | McGowan et al. |
| 5,883,423 A | 3/1999 | Patwa et al. |
| 6,166,403 A | 12/2000 | Castagnetti et al. |
| 6,278,148 B1 | 8/2001 | Watanabe et al. |
| 6,411,494 B1 | 6/2002 | Watt |
| 6,448,114 B1 | 9/2002 | An et al. |
| 6,467,074 B1 | 10/2002 | Katsioulas et al. |
| 6,476,695 B1 | 11/2002 | Nakamichi |
| 6,580,289 B2 | 6/2003 | Cox |
| 6,588,005 B1 | 7/2003 | Kobayashi et al. |
| 6,614,645 B1 | 9/2003 | Sakurai et al. |
| 6,646,323 B2 | 11/2003 | Dirnecker et al. |
| 6,646,860 B2 | 11/2003 | Takaramoto et al. |
| 6,982,454 B2 | 1/2006 | Giuroiu et al. |
| 7,239,194 B2 | 7/2007 | Azrai et al. |
| 2002/0085334 A1 | 7/2002 | Figueroa et al. |
| 2002/0186045 A1 | 12/2002 | Cox |
| 2004/0004241 A1 | 1/2004 | Aton |
| 2004/0129966 A1 | 7/2004 | Giuroiu et al. |

FOREIGN PATENT DOCUMENTS

| | | |
|---|---|---|
| EP | 0 499 383 | 8/1992 |

OTHER PUBLICATIONS

Triad Semiconductor, Inc., International Application Serial No. PCT/US2005/005836, "Written Opinion," Aug. 1, 2005.

Triad Semiconductor, Inc., International Application Serial No. PCT/US2005/011361, "International Search Report," Aug. 5, 2005.

Triad Semiconductor, Inc., International Application Serial No. PCT/US2005/011361, "Written Opinion," Aug. 5, 2005.

Triad Semiconductor, Inc., "International Preliminary Report on Patentability," Jul. 6, 2006.

Triad Semiconductor, Inc, "International Preliminary Examination Report," Jul. 14, 2006.

\* cited by examiner

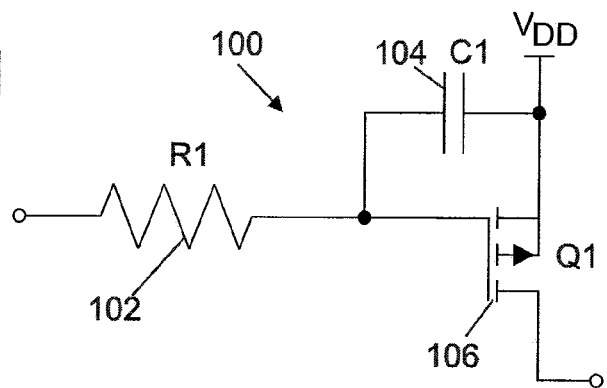
FIG. 1
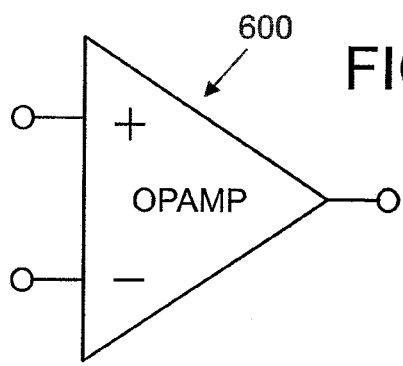
FIG. 6
FIG. 4
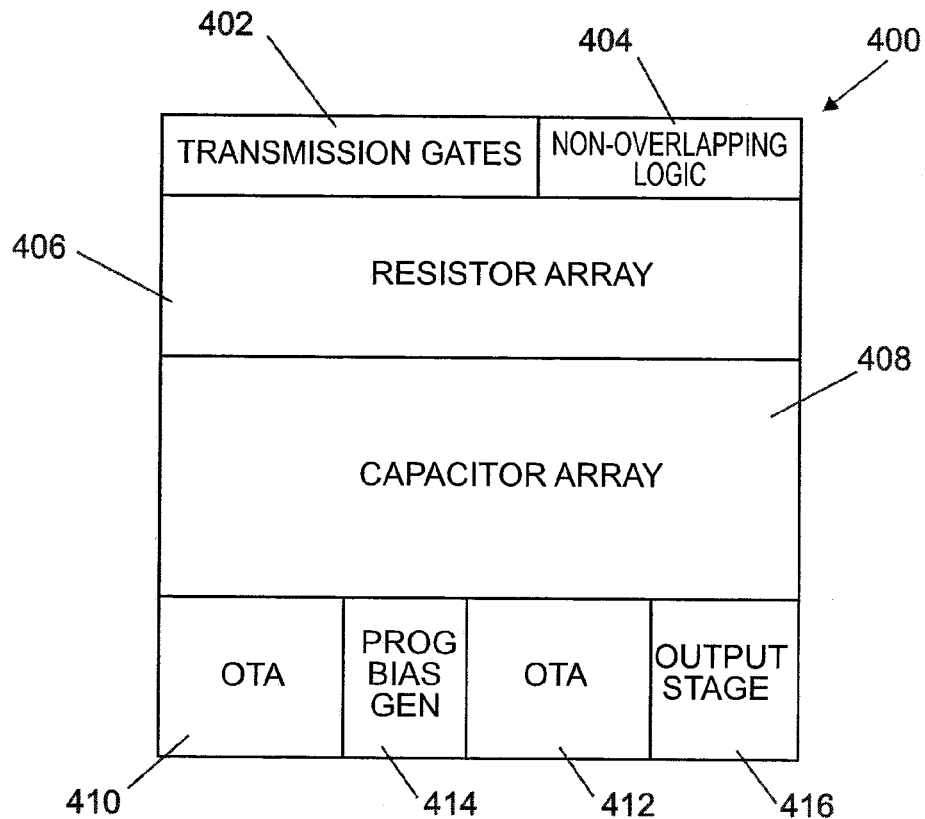

VIA CONFIGURABLE ARCHITECTURE FOR CUSTOMIZATION OF ANALOG CIRCUITRY IN A SEMICONDUCTOR DEVICE

RELATED APPLICATIONS

This application is a Divisional of U.S. patent application Ser. No. 10/907,456, filed Apr. 1, 2005, now U.S. Pat. No. 7,449,371, which claims priority to provisional patent application Ser. No. 60/559,400, filed Apr. 2, 2004. The entire disclosures of the above-identified applications are incorporated herein by reference.

BACKGROUND

Application specific integrated circuits (ASICs) have been available for a number of years. A full-custom ASIC is a device which requires all layers in a semiconductor process to be created in a custom fashion. The process of creating a full-custom ASIC is costly, time consuming, and error prone. Throughout the years much effort has been put in to minimizing the drawbacks of full-custom ASICs. The gate array was created for smaller logic designs where the base chip came as an array of standard digital cells (e.g. AND, OR, and NAND gates). The final product was realized by adding the layers required to interconnect these standard cells to realize a particular function. A gate array is considered a semi-custom ASIC. Some time after gate arrays came field programmable gate arrays (FPGAs). As the name implies, the FPGA all but eliminated the custom portion of the design process. By virtue of their field programmability, there is no fabrication in the development process. However, FPGA technology is not able to compete with full-custom ASIC technology on performance and device cost. More recently, the use of gate arrays has increased with the advent of structured array technology which is essentially equivalent to gate arrays, but on a much larger scale. Most structured arrays minimize the number of layers that have to be configured, yet still offer significant performance and device cost advantages when compared to FPGAs.

Thus far, structured array technology has focused on all digital devices. Most structured arrays combine large numbers of logic circuits into a logic cell to create a device that is specifically adapted for a particular application, but at a cost that is lower than that of developing a completely new device from scratch. Like most integrated circuits, structured arrays are manufactured using a lithographic process that depends on having a mask for each layer of the chip. Some masks may be generic, but others are custom. It is the custom masks that impart the application specificity to the chip by programming the logic cells during the manufacturing process. Reducing the number of custom masks to just one mask provides significant cost and time savings. A "one mask" device allows all of the masks to remain generic except for a single mask, thus allowing the semiconductor manufacturer to invest in the generic or base masks just one time. Various designs may be implemented by customizing just a single mask instead of a complete mask set.

SUMMARY

The present invention provides for a semiconductor device having a plurality of layers and a plurality of circuit elements arranged in tiles. In exemplary embodiments, the plurality of layers may include three metal layers, one polysilicon layer, and one via layer. At least one of the plurality of layers in the semiconductor device is a via layer configured to determine the interconnection of the plurality of circuit elements. The plurality of circuit elements may be analog circuit elements and/or digital circuit elements that are arranged into analog tiles and digital tiles that form a mixed signal structured array.

In some embodiments, the semiconductor device includes an interconnection quilt that has a plurality of metal layers disposed to interconnect the plurality of circuit elements. The interconnection quilt may configure the semiconductor device using at least one of the plurality of layers.

The inclusion of analog circuit elements with digital circuit elements such as those described above creates a "mixed signal" device that can facilitate a wide variety of analog functions such as gain stages, filters, and modulators. By making the analog and digital configurable with single layer configurability a "one mask mixed signal structure array" can be implemented resulting in a semi-custom mixed signal solution for a fraction of the cost and development time.

BRIEF DESCRIPTION OF THE DRAWINGS

FIG. 1 provides a schematic diagram representing a circuit according to at least some embodiments of the present invention.

FIG. 4 illustrates an analog tile according to at least some embodiments of the present invention.

FIG. 6 provides a schematic diagram representing an operational amplifier according to at least some embodiments of the present invention.

DESCRIPTION OF THE INVENTION

It is to be understood that the present invention is not limited to the example embodiments disclosed herein. The meaning of certain terms as used in the context of this disclosure should be understood as follows. The term "metal layer" refers to any layers that are used to make connections between various elements within a device. The metal layers may contain actual metal routing traces, contacts, or vias. A via may be formed by etching material as defined by a mask layer in the fabrication process or direct exposure to an electron beam. The resulting hole from the etching is then filled by metal and is used to vertically interconnect between metal layers in an integrated circuit. Other terms will either be discussed when introduced, or otherwise should be assumed to have the conventional meaning as understood by persons of ordinary skill in the semiconductor arts.

A semiconductor device according to an embodiment of the present invention comprises a plurality of layers and circuit elements that are configured using the via layer during the manufacturing process. The circuit elements may be analog circuit elements and/or digital circuit elements. A semiconductor device according to the present invention may be realized in various semiconductor processes including but not limited to CMOS, BiCMOS, SiGE, and GaAs MESFET.

FIG. 1 provides a schematic diagram representing a circuit according to at least some embodiments of the present invention. A circuit 100 comprises a resistor 102 (R1), a capacitor 104 (C1), and a metal-oxide-semiconductor field-effect transistor (MOSFET) 106 (Q1). MOSFET 106 has gate, source, body, and drain terminals. In the circuit 100, resistor 102 is connected to one terminal of capacitor 104 and the gate terminal of MOSFET 106. The second terminal of capacitor 104 is connected to the source and body terminals of MOSFET 106 and a voltage VDD.

The semiconductor process used to manufacture an integrated circuit such as the one shown in FIG. 1 can have at least four metal layers; however, it is possible to implement some embodiments of the present invention with as few as two metal layers. Various circuit elements such as capacitors, resistors, and transistors are fabricated in the base process layers such as the well, diffusion, polysilicon, and metal 1 layers.

Figure 2:
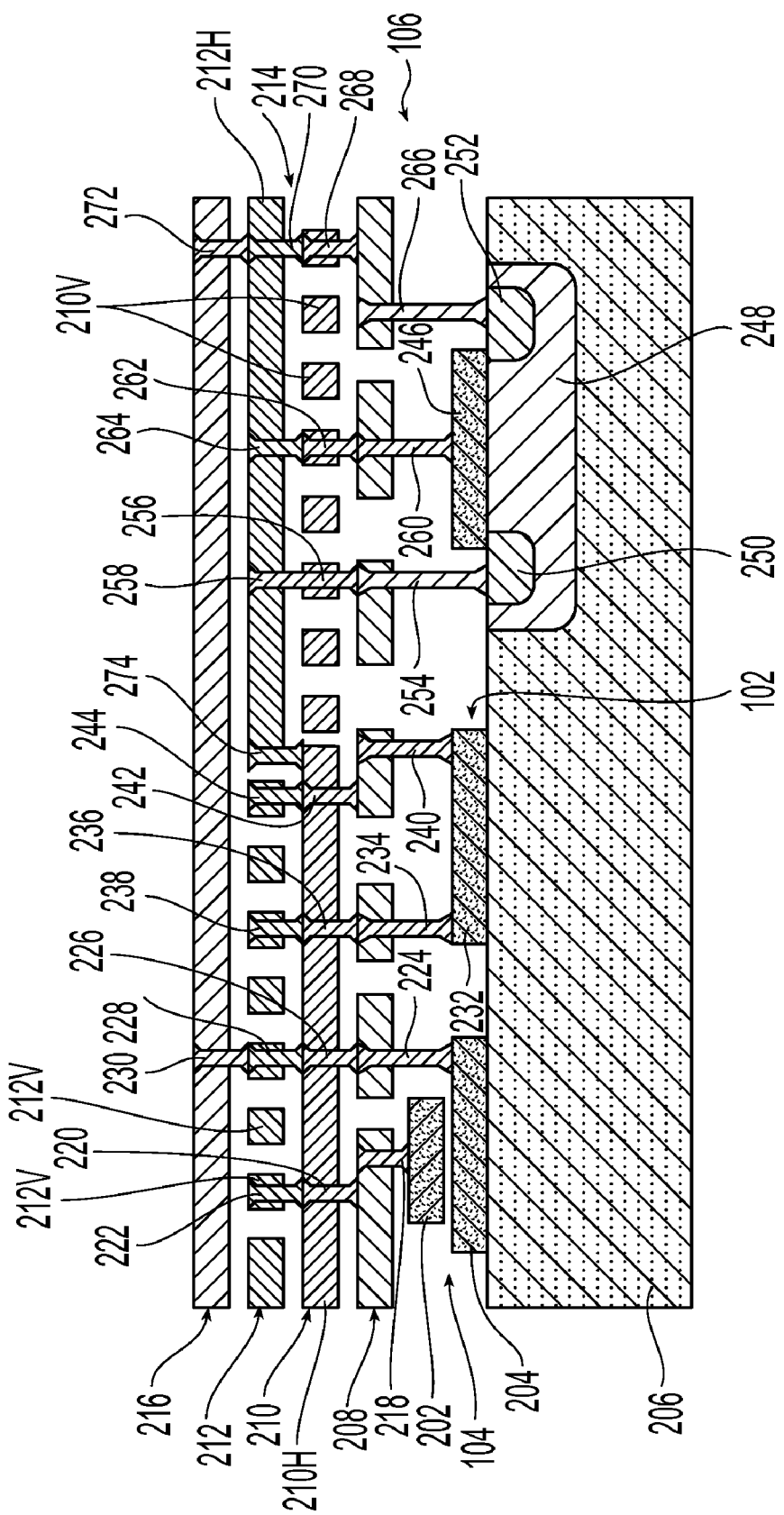
FIG. 2 illustrates a side view of the semiconductor layers forming the circuitry of FIG. 1 according to at least some embodiments of the present invention.
Figure 3:
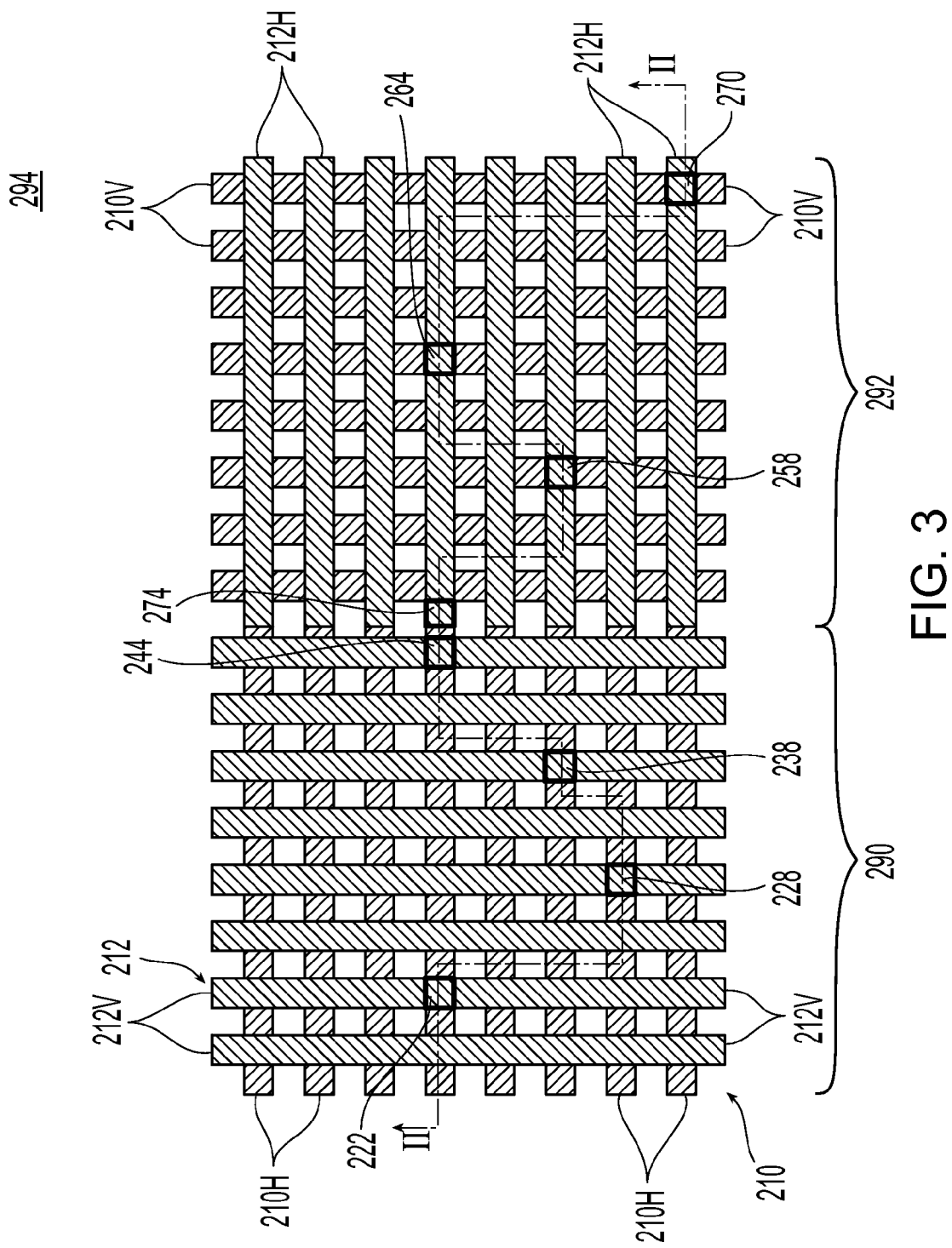
FIG. 3 illustrates the metal 2 and 3 layers forming the circuitry of FIG. 1 according to at least some embodiments of the present invention.

FIG. 2 illustrates a side view of the semiconductor layers forming the circuitry of FIG. 1 according to at least some embodiments of the present invention. A first metal layer (metal 1) 208 is provided for making various permanent connections within the integrated circuit. A second metal layer (metal 2) comprises metal 2 lower routing tracks 210 and a third metal layer (metal 3) comprises metal 3 upper routing tracks 212. The metal 2 lower routing tracks 210 are comprised of horizontal lower routing tracks 210H and vertical lower routing tracks 210V, and the metal 3 upper routing tracks 212 are comprised of horizontal upper 212H routing tracks and vertical upper routing tracks 212V, as is shown in FIG. 3. The routing tracks are used to interconnect the circuit elements, and they are formed of segmented wires of fixed length that may be connected end-to-end using a single via layer defined by one mask of the manufacturing process. Discussion of the use of via masks and programmable vias to customize a semiconductor device can be found in U.S. Pat. No. 6,580,289, which is incorporated herein by reference. The metal 2 lower routing tracks 210 and metal 3 upper routing tracks 212 are interconnected using a programmable via layer 214 (detail omitted for clarity). A forth metal layer (metal 4) 216 is shown and is used to provide power and ground for the circuit.

In the embodiment as shown, the capacitor 104 (see FIG. 1) is formed by the polysilicon layers 202 and 204 where an oxide (detail omitted for clarity) between the polysilicon layers is thinner than normal inter-layer oxides. Beneath the capacitor 104 is a p-type silicon substrate 206. The polysilicon layers 202 and 204 of capacitor 104 are connected to at least one metal routing layer that is used to connect the capacitor to other circuit elements or bond pads within the integrated circuit. The top polysilicon layer 202 is connected to the metal routing layers by way of contacts 218 and 220 and via 222. The bottom polysilicon layer 204 is connected to the metal routing layers by way of contacts 224, 226, and 230 and via 228. While the specific embodiment of the present invention described herein illustrate a capacitor comprising two polysilicon layers, any semiconductor process with a means to realize capacitors using various layers, such as for example two metal layers, and other layers for routing can be used.

The resistor 102 (see FIG. 1) is formed by the polysilicon layer 232, which is over the silicon substrate 206. The polysilicon layer 232 of resistor 102 is connected to at least one metal routing layer that is used to connect the resistor to other circuit elements or bond pads within the integrated circuit. The polysilicon layer 232 is connected to the metal routing layers by way of contacts 234, 236, 240, and 242 and vias 238 and 244. While the specific embodiment of the present invention described herein illustrate a resistor comprising one polysilicon layer, any semiconductor process with a means to realize resistors using various layers and other layers for routing can be used.

MOSFET 106 (see FIG. 1) is a p-channel type device that is formed by the polysilicon layer 246. Beneath MOSFET 106 is an n-well 248 and two p+ implants 250 and 252 that are diffused into the silicon substrate 206. The polysilicon layer 246 and p+ implants 250 and 252 are connected to at least one metal routing layer that is used to connect the MOSFET 106 to other circuit elements or bond pads within the integrated circuit. The polysilicon layer 246 is connected to the metal routing layers by way of contacts 260 and 262 and via 264. The p+ implant 250 is connected to the metal routing layers by way of contacts 254 and 256 and via 258. The p+ implant 252 is connected to the metal routing layers by way of contacts 266, 268, and 272 and via 270. Via 274 is used to connect two routing tracks 210H, 212H in the second 210 and third 212 metal layers. While the specific embodiment of the present invention described herein illustrate a MOSFET comprising one polysilicon layer, an n-well, and two p+ implants, any semiconductor process with a means to realize MOSFETS using various layers and other layers for routing can be used.

FIG. 3 illustrates the metal 2 and 3 layers forming the circuitry of FIG. 1 according to at least some embodiments of the present invention. The metal 2 lower routing tracks 210 and the metal 3 upper routing tracks 212 may be used to interconnect capacitor 104, resistor 102, and MOSFET 106 (see FIG. 2) to each other or to other circuit elements or bond pads within the integrated circuit. In the embodiment as shown, there is a routing grid comprising a first set of eight horizontal metal 2 lower routing tracks 210H that run perpendicular to a first set of eight vertical metal 3 upper routing tracks 212V, which forms a first fabric square or first section 290. There is also a second set of eight vertical metal 2 lower routing tracks 210V that run perpendicular to a second set of eight horizontal metal 3 upper routing tracks 212H, which forms a second fabric square or second section 292. Each fabric square is comprised of routing tracks from the second and third metal layers that can be rotated 90° relative to adjacent fabric squares which facilitates the routing of signals between the circuit elements. The routing tracks form an interconnect quilt 294 comprised of multiple fabric squares 290, 292. As seen in FIG. 3, the lower horizontal routing tracks 210H of one layer (metal 2) in section 290 are aligned with upper horizontal routing tracks 212H of a different layer (metal 3) in adjacent section 292.

All of the direct connections are made to the circuit elements using the lower metal 2 routing tracks 210. The remaining metal 2 routing tracks 210 and all of the upper metal 3 routing tracks 212 may be used for signal routing. The interconnections between the second and third metal layers may be accomplished using vias, such as the programmable vias described in connection with FIG. 2, where the vertical routing tracks 210V, 212V and the horizontal routing tracks 210H, 212H cross each other. Such interconnections are shown in FIG. 3 by vias 222, 228, 238, 244, 258, 264, 270, and 274. Using programmable vias to interconnect the second and third metal layers can be automated; therefore, no manual signal routing may be required.

As shown above, the circuit elements such as capacitors, resistors, transistor, etc. are fabricated in the layers beneath the second and third metal layers and hence form the circuit foundation. The circuit foundation is made up of analog and/or digital circuit elements that are arranged in tiles. An analog tile may comprise virtually any type of analog circuit elements that can be developed using MOSFETs, BJTs, resistors, capacitors, diodes, etc. FIG. 4 illustrates an analog tile according to at least some embodiments of the present invention. Analog tile 400 comprises transmission gates 402, non-overlapping logic 404, resistor array 406, capacitor array 408, operational transconductance amplifiers (OTAs) 410 and 412, programmable bias generator 414, and output stage 416.

Transmission gates 402 may be a via configurable transmission gate array that contains several CMOS analog switches for use in switched capacitor circuits or to gate analog signals. Non-overlapping logic 404 may be a via configurable non-overlap logic array composed of logic elements that can be configured to make a non-overlapping clock generator for switched capacitor applications. This logic could also be used for other logic functions related to analog signal processing and control. Resistor array 406 may be a via configurable resistor array composed of multiple unit resistors that can be via configured in a series or parallel arrangement. Alternatively, resistor array 406 could be configured as multiple individual resistors of various values. Capacitor array 408 may be a via configurable capacitor array composed of multiple unit capacitors that can be via configured in a series or parallel arrangement. In addition to the unit capacitors, the via configurable capacitor array may also contain fractional units (remainders), allowing for greater resolution in capacitance value. Additional information regarding a via configurable capacitor array can be found in the U.S. patent application filed by David Ihme et al. with the United States Patent and Trademark Office on Feb. 26, 2005, Ser. No. 10/906,527, now U.S. Pat. No. 7,335,966, entitled "Configurable Integrated Circuit Capacitor Array Using Via Mask Layers," which is incorporated herein by reference.

Figure 5:
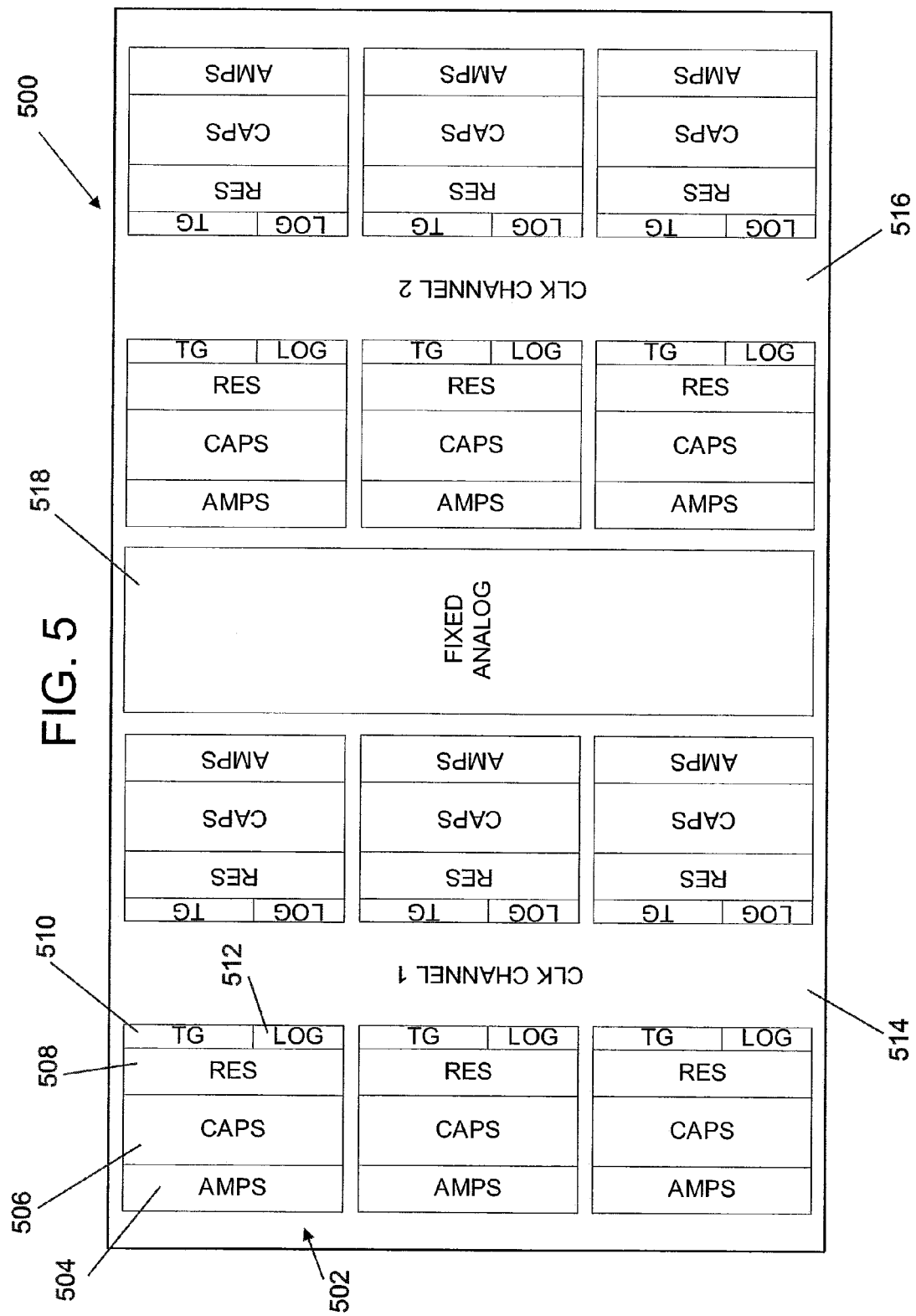
FIG. 5 illustrates an analog structured array formed by several analog tiles according to at least some embodiments of the present invention.

A device composed of a number of analog tiles would be referred to as an analog structured array (ASA). FIG. 5 illustrates an analog structured array according to at least some embodiments of the present invention. Analog structured array 500 is made up of multiple analog tiles 502. Each individual analog tile can be configured to realize analog functions such as amplifiers, active filters, sigma-delta modulators, etc. In the embodiment as shown, analog tile 502 comprises amplifiers 504, capacitors 506, resistors 508, transmission gates 510, and non-overlapping logic 512. Clock channels 514 and 516 may be used between the analog tiles to route digital clocks and control signals. This helps to minimize the interference with sensitive analog signals. The analog structured array 500 may also include a fixed analog section 518 that contains functional analog blocks such as temperature sensors, bandgap references, bias voltage resistive dividers, etc. The fixed analog section 518 is optional, but it may be useful in the implementation of larger functions using the analog tiles. Multiple analog tiles 502 can by tied together using an interconnect quilt (see FIG. 3) and configured using the via layer between the second and third metal layers to form larger functional blocks such as analog-to-digital converters, high order active filters, etc.

Figure 7:
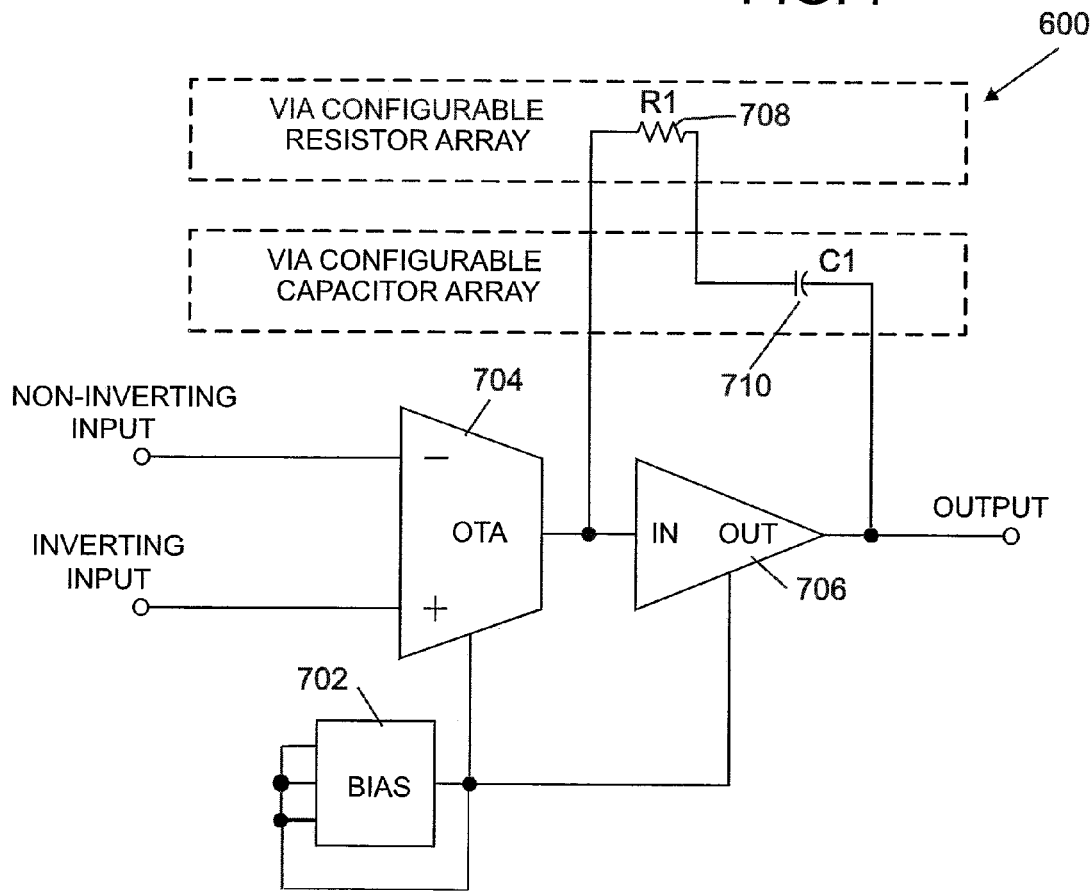
FIG. 7 provides a schematic diagram representing an analog tile configured to form the circuitry of FIG. 6 according to at least some embodiments of the present invention.

FIG. 6 provides a schematic diagram representing an operational amplifier (OPAMP) 600 according to at least some embodiments of the present invention. The operational amplifier 600 has two input terminals that are connected to a positive voltage and a negative voltage and one output terminal. FIG. 7 shows a portion of an analog tile (see FIG. 4) configured as the operational amplifier 600 shown in FIG. 6. The operational amplifier 600 comprises a programmable bias generator 702, an operational transconductance amplifier 704, an output stage 706, a resistor 708 (R1), and a capacitor 710 (C1). In the operational amplifier 600, the operational transconductance amplifier 704 has a non-inverting input terminal and an inverting input terminal. The output terminal of the operational transconductance amplifier 704 is connected to one terminal of the resistor 708 and to the input terminal of the output stage 706. The second terminal of resistor 708 is connected to one terminal of capacitor 710. The second terminal of capacitor 710 is connected to the output terminal of the output stage 706. The output stage 706 is used to form the operational amplifier 600 because the operational transconductance amplifier 704 typically has very high output impedance and is not suitable for driving resistive loads by itself. With the addition of output stage 706, operational amplifier 600 requires compensation, which is accomplished by using resistor 708 and capacitor 710. A programmable bias generator is connected to both operational transconductance amplifier 704 and output stage 706.

In the embodiment as shown, the circuit elements necessary to create the operational amplifier 600 may be provided in an analog tile as shown in FIG. 4. The programmable bias generator 702, operational transconductance amplifier 704, output stage 706, resistor 708, and capacitor 710 are fabricated in the layers beneath the second and third metal layers to form the circuit foundation. Resistor 708 and capacitor 710 may be formed using resistors and capacitors from a resistor array or capacitor array as also shown in FIG. 4. The routing tracks in the second and third metal layers may be used to interconnect the various circuit elements using vias, such as the programmable vias described in connection with FIG. 2. While the embodiment as shown in FIG. 7 illustrates only analog circuit elements, the circuit foundation may include tiles that provide analog and/or digital circuit elements.

Figure 8:
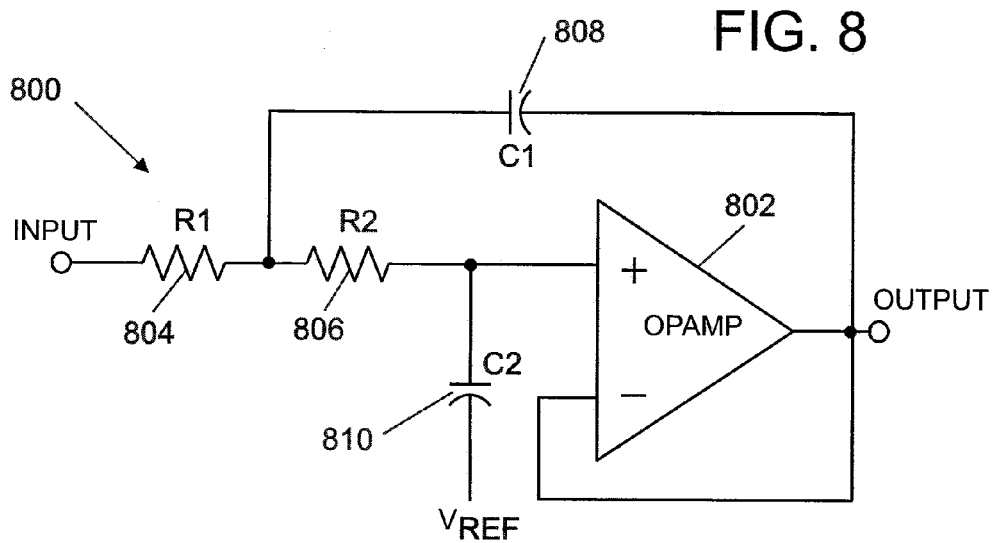
FIG. 8 provides a schematic diagram representing a Sallen-Key Low-Pass Filter according to at least some embodiments of the present invention.

FIG. 8 provides a schematic diagram representing a Sallen-Key Low-Pass Filter according to at least some embodiments of the present invention. A filter circuit 800 comprises an operational amplifier 802, a resistor 804 (R1), a resistor 806 (R2), a capacitor 808 (C1), and a capacitor 810 (C2). In the filter circuit 800, operational amplifier 802 has a positive voltage input terminal, a negative voltage input terminal, and an output terminal. Resistor 804 is connected to one terminal of resistor 806 and capacitor 808. The second terminal of capacitor 808 is connected to the output terminal of operational amplifier 802 and the negative voltage input terminal of operational amplifier 802. The second terminal of resistor 806 is connected to one terminal of capacitor 810 and the positive voltage input terminal of operational amplifier 802. The second terminal of capacitor 810 is connected to a voltage VREF.

Figure 9:
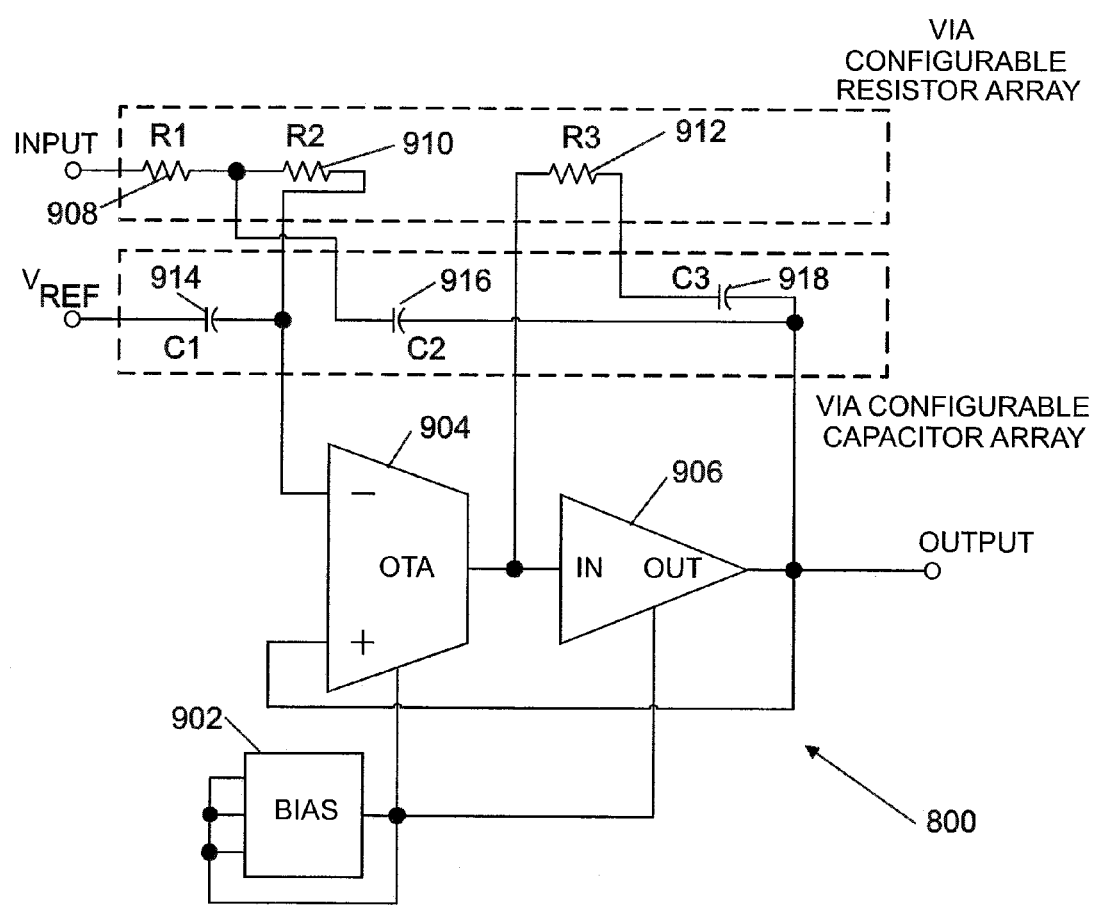
FIG. 9 provides a schematic diagram representing an analog tile configured to form the circuitry of FIG. 8 according to at least some embodiments of the present invention.

FIG. 9 provides a schematic diagram representing an analog tile (see FIG. 4) configured to form the circuitry of FIG. 8 according to at least some embodiments of the present invention. The filter circuit 800 comprises a programmable bias generator 902, an operational transconductance amplifier 904, an output stage 906, resistors 908, 910, and 912 (R1, R2, and R3), and capacitors 914, 916, and 918 (C1, C2, and C3). In the filter circuit 800, the operational transconductance amplifier 904 has a non-inverting input terminal and an inverting input terminal (see FIG. 7). The output terminal of the operational transconductance amplifier 904 is connected to one terminal of the resistor 912 and to the input terminal of the output stage 906. The second terminal of resistor 912 is connected to one terminal of capacitor 918. The second terminal of capacitor 918 is connected to the output terminal of the output stage 906, one terminal of capacitor 916, and the inverting input terminal of the operational transconductance amplifier 904. The second terminal of capacitor 916 is connected to one terminal of resistors 908 and 910. The second terminal of resistor 910 is connected to one terminal of capacitor 914 and the non-inverting input terminal of the operational transconductance amplifier 904. The second terminal of capacitor 914 is connected to a voltage VREF. The output stage 906 is used in the filter circuit 800 because the operational transconductance amplifier 904 typically has very high output impedance and is not suitable for driving resistive loads by itself. With the addition of output stage 906, compensation is required, which is accomplished by using resistor 912 and capacitor 918. A programmable bias generator is connected to both operational transconductance amplifier 904 and output stage 906.

In the embodiment as shown, the circuit elements necessary to create the filter circuit 800 may be provided in an analog tile as shown in FIG. 4. The programmable bias generator 902, operational transconductance amplifier 904, output stage 906, resistors 908, 910, and 912, and capacitors 914, 916, and 918 are fabricated in the layers beneath the second and third metal layers to form the circuit foundation. Resistors 908, 910, and 912 and capacitors 914, 916, and 918 may be formed using resistors and capacitors from a resistor array or capacitor array as also shown in FIG. 4. The routing tracks in the second and third metal layers may be used to interconnect the various circuit elements using vias, such as the programmable vias described in connection with FIG. 2. While the embodiment as shown in FIG. 9 illustrates only analog circuit elements, the circuit foundation may include tiles that provide analog and/or digital circuit elements.

Figure 10:
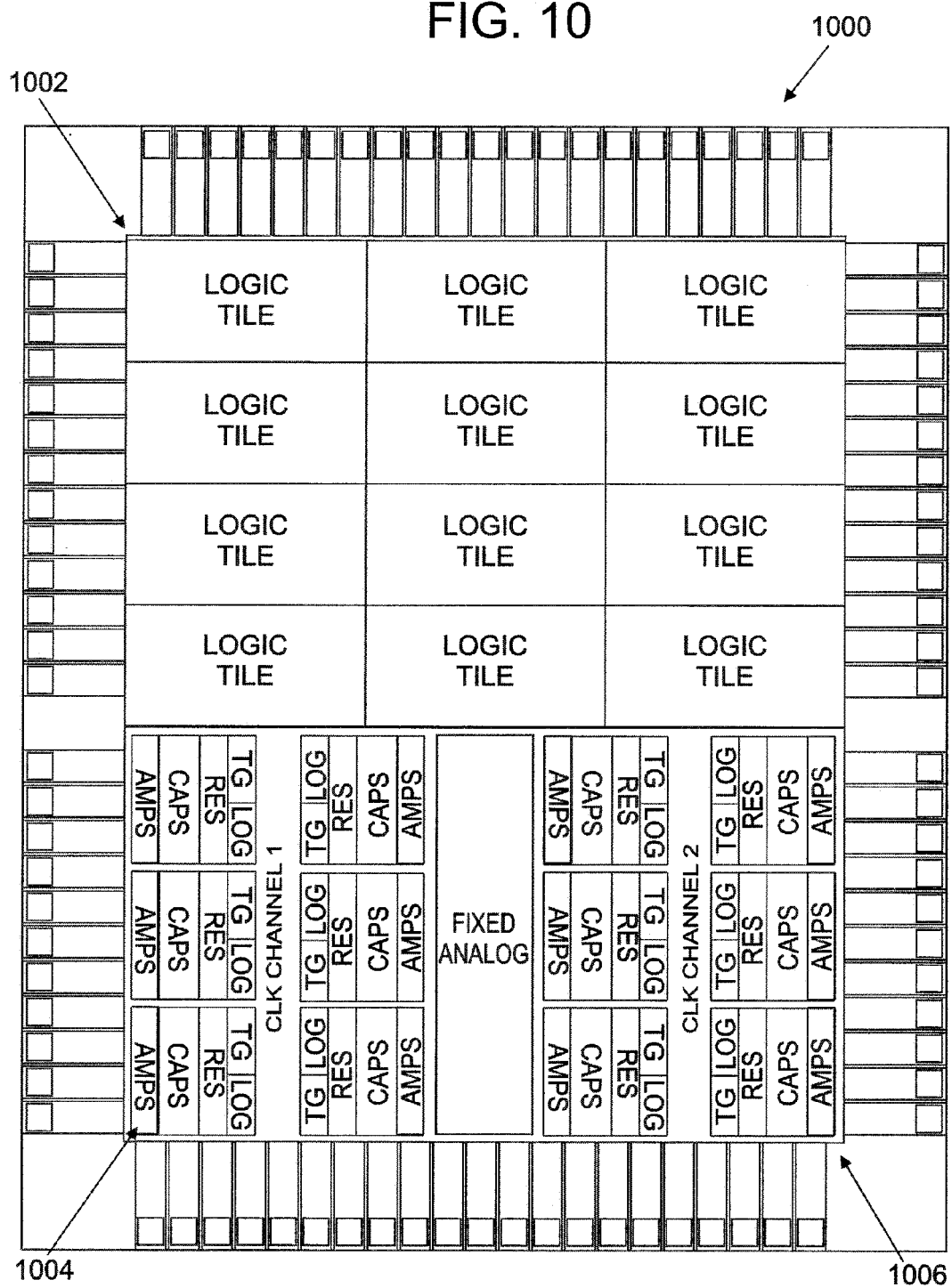
FIG. 10 illustrates a mixed signal structured array according to at least some embodiments of the present invention.

FIG. 10 illustrates a mixed signal structured array according to at least some embodiments of the present invention. As discussed above, the circuit foundation that is formed in the layers beneath the second and third metal layers may include tiles having analog and/or digital circuit elements. Furthermore, analog tiles can be placed on a circuit foundation with logic or digital tiles comprised of digital circuit elements such as logic gates, logic cells, functional digital blocks, and/or random access memory (RAM). Discussion regarding the use of logic cells in a semiconductor device can be found in U.S. Pat. No. 6,580,289, which is incorporated herein by reference. Additional background information relative to the present disclosure can be found in U.S. Pat. No. 6,693,454, which is also incorporated herein by reference.

FIG. 10 illustrates an integrated circuit 1000 containing multiple logic tiles 1002 and multiple analog tiles 1004 (see FIG. 4). FIG. 10 also illustrates the use of an analog structured array 1006 (see FIG. 5) in the integrated circuit 1000. The use of various types of analog and digital tiles within the integrated circuit 1000 may be referred to as a mixed signal structured array (MSSA). The use of an interconnect quilt (see FIG. 3) remains as described above; however, the integrated circuit 1000 is now able to incorporate analog and digital functions within the same device and it may be configured using the via layer between the second and third metal layers. The via layer may use programmable vias such as those described in connection with FIG. 2. Thus, FIG. 2, FIG. 3, FIG. 4, FIG. 5, and FIG. 10 together illustrate both a structure and a method of assembling example embodiments of the invention.

Specific embodiments of an invention are described herein. One of ordinary skill in the semiconductor arts will quickly recognize that the invention has other applications in other environments. In fact, many embodiments and implementations are possible. The following claims are in no way intended to limit the scope of the invention to the specific embodiments described above.

What is claimed is:

1. A semiconductor device comprising:
   a circuit foundation comprising a first plurality of circuit elements;
   an interconnect quilt formed over the circuit elements, the interconnect quilt comprising a plurality of sections adjacent to one another, each section having a first layer comprising upper routing tracks and a second layer comprising lower routing tracks with the upper routing tracks crossing over the lower routing tracks at crossover points, the routing tracks in the first and second layers belonging to one section being rotated 90° relative to the routing tracks in the corresponding layers belonging to an adjacent section, and the first plurality of circuit elements being connected to the lower routing tracks; and
   a plurality of vias connecting the upper routing tracks to the lower routing tracks at only some of the crossover points in each of a plurality of sections, to thereby interconnect some of said first plurality of circuit elements and form an electrical circuit.

2. The semiconductor device according to claim 1, wherein:
   vias connect routing tracks in one layer of one section that are aligned with routing tracks in a different layer of an adjacent section.

3. The semiconductor device according to claim 1, wherein:
   the vias all belong to a single programmable via layer.

4. The semiconductor device according to claim 1, further comprising:
   a metal shield layer above the plurality of circuit elements and below the interconnect quilt.

5. The semiconductor device according to claim 1, further comprising:
   a metal layer above the layer comprising upper routing tracks.

6. The semiconductor device according to claim 1, wherein:
   said circuit foundation comprises a first plurality of circuit elements of at least three different types; and
   said vias connect the upper routing tracks to the lower routing tracks such that the electrical circuit includes circuit elements of at least three different types.

7. The semiconductor device according to claim 6, wherein:
   the circuit elements of at least three different types includes both analog circuit elements and digital circuit elements.

8. The semiconductor device according to claim 1, wherein:
   the first plurality of circuit elements comprises a plurality of analog circuit elements and a plurality of digital circuit elements
   the plurality of analog circuit elements are arranged in analog tiles;
   the plurality of digital circuit elements are arranged in digital tiles; and
   said plurality of vias connect at least some of the analog tiles to least some of the digital tiles to thereby form a mixed signal electrical circuit.

9. The semiconductor device according to claim 1, comprising:
   at least one of a fixed analog section and a clock channel.

10. The semiconductor device according to claim 1, wherein:

the interconnect quilt forms one or more functional blocks selected from a group consisting of analog functional blocks, digital functional blocks, and combinations thereof.

11. The semiconductor device according to claim 1, comprising:
at least three metal layers, at least one polysilicon layer, and the at least one via layer to interconnect said plurality of circuit elements.

12. A semiconductor device comprising:
a circuit foundation comprising a first plurality of circuit elements, the circuit foundation having an interconnect quilt over the circuit elements, the interconnect quilt comprising a plurality of sections adjacent to one another, each section having a first layer comprising upper routing tracks and a second layer comprising lower routing tracks with the upper routing tracks crossing over the lower routing tracks at crossover points, the routing tracks in the first and second layers belonging to one section being rotated 90° relative to the routing tracks in the corresponding layers belonging to an adjacent section, and the first plurality of circuit elements being connected to the lower routing tracks; and
a plurality of vias connecting the upper routing tracks to the lower routing tracks at only some of the crossover points in each of a plurality of sections, to thereby interconnect some of said first plurality of circuit elements and form an electrical circuit.

13. A semiconductor device comprising:
a first plurality of circuit elements arranged in tiles;
a first set of lower routing tracks which extend in a first direction over a first circuit element;
a second set of lower routing tracks which extend in a second direction over a second circuit element, the second direction being perpendicular to the first direction;
at least one routing track in said first set of lower metal routing tracks being connected to the first circuit element;
at least one routing track in said second set of lower routing tracks being connected to the second circuit element;
a first set of upper routing tracks extending in said second direction and crossing over the first set of lower routing tracks;
a second set of upper routing tracks extending in said first direction and crossing over the second set of lower routing tracks; and
a plurality of vias in a via layer connecting some of the upper routing tracks to some of the lower routing tracks, such that the first and second circuit elements are electrically connected to one another by upper and lower routing tracks.

14. The semiconductor device according to claim 13, wherein the via layer is a single programmable via layer.

15. The semiconductor device according to claim 13, comprising:
an interconnect quilt comprising a plurality of layers disposed to interconnect the plurality of circuit elements.

16. The semiconductor device according to claim 15, wherein the interconnect quilt imparts configuration to the semiconductor device using at least one of the plurality of layers, the configuration being imparted to form functional blocks.

17. The semiconductor device according to claim 16, wherein the functional blocks are selected from a group consisting of analog functional blocks, digital functional blocks, and combinations thereof.

18. The semiconductor device according to claim 13, wherein:
the first plurality of circuit elements comprises a plurality of analog circuit elements and a plurality of digital circuit elements
the plurality of analog circuit elements are arranged in analog tiles;
the plurality of digital circuit elements are arranged in digital tiles; and
said plurality of vias connect at least some of the analog tiles to least some of the digital tiles to thereby form a mixed signal electrical circuit.

19. The semiconductor device according to claim 13, wherein the tiles comprises analog tiles and digital tiles that form a mixed signal structured array.

20. The semiconductor device according to claim 13, comprising:
at least one of a fixed analog section and a clock channel.

21. The semiconductor device according to claim 13, wherein:
the interconnect quilt forms one or more functional blocks selected from a group consisting of analog functional blocks, digital functional blocks, and combinations thereof.

22. The semiconductor device according to claim 13, comprising:
at least three metal layers, at least one polysilicon layer, and the at least one via layer to interconnect said plurality of circuit elements.

* * * * *